United States Patent
Jacobson et al.

(10) Patent No.: US 8,385,068 B2
(45) Date of Patent: Feb. 26, 2013

(54) COOLING OF ELECTRICAL COMPONENTS

(75) Inventors: Björn Jacobson, Grängesberg (SE); Per-Olof Hedblad, Ludvika (SE)

(73) Assignee: ABB Technology AG, Zurich (CH)

(*) Notice: Subject to any disclaimer, the term of this patent is extended or adjusted under 35 U.S.C. 154(b) by 0 days.

(21) Appl. No.: 13/378,326

(22) PCT Filed: Jun. 16, 2009

(86) PCT No.: PCT/EP2009/057463
§ 371 (c)(1), (2), (4) Date: Jan. 13, 2012

(87) PCT Pub. No.: WO2010/145694
PCT Pub. Date: Dec. 23, 2010

(65) Prior Publication Data
US 2012/0099273 A1 Apr. 26, 2012

(51) Int. Cl.
*H05K 7/20* (2006.01)
(52) U.S. Cl. ....... 361/699; 361/689; 361/692; 165/80.4; 165/104.33
(58) Field of Classification Search .................. None
See application file for complete search history.

(56) References Cited

U.S. PATENT DOCUMENTS

| | | | |
|---|---|---|---|
| 6,501,172 B1 | 12/2002 | Fukada et al. | |
| 6,807,056 B2* | 10/2004 | Kondo et al. | 361/689 |
| 6,958,911 B2* | 10/2005 | Cader et al. | 361/699 |
| 7,639,499 B1* | 12/2009 | Campbell et al. | 361/699 |
| 8,079,223 B2* | 12/2011 | Bell | 62/3.7 |

FOREIGN PATENT DOCUMENTS

| | | |
|---|---|---|
| DE | 101 00 620 A1 | 12/2001 |
| GB | 2 001 194 A | 7/1977 |
| JP | 5-129427 A | 5/1993 |
| JP | 5-129487 A | 5/1993 |
| JP | 9-307039 A | 11/1997 |
| RU | 1187225 A1 | 10/1985 |
| WO | WO 2007/149023 A1 | 12/2007 |

OTHER PUBLICATIONS

International Search Report for PCT/EP2009/057463 dated Mar. 18, 2010.
Written Opinion of the ISA for PCT/EP2009/057463 dated Mar. 18, 2010.

* cited by examiner

*Primary Examiner* — Boris Chervinsky
(74) *Attorney, Agent, or Firm* — Birch, Stewart, Kolasch & Birch, LLP

(57) ABSTRACT

The invention concerns a converter as well as a cooling device and a method for cooling at least a first and a second group of electrically interconnected electrical components (SWA1, SWA2, SWA3, SWA4, SWA5, SWA6, SWA7, SWA8, SWB1, SWB2, SWB3, SWB4, SWB5, SWB6, SWB7, SWB8) in the converter, where the first and second groups are placed on opposite sides of a conductor leading to a connection terminal of the converter. The cooling device (22) comprises a first transporting arrangement (HSA1, HSA2, HSA3, HSA4, HSA5, HSA6, HSA7, HSA8, HSA9, COA1, COA2, COA3, COA4, COA5, COA6, COA7, COA8) transporting cooling medium (M) past the first group and a second transporting arrangement (HSB1, HSB2, HSB3, HSB4, HSB5, HSB6, HSB7, HSB8, HSB9, COB1, COB2, COB3, COB4, COB5, COB6, COB7, COB8) transporting the same cooling medium past the second group.

20 Claims, 5 Drawing Sheets

COOLING OF ELECTRICAL COMPONENTS

FIELD OF INVENTION

The present invention generally relates to cooling of electrical components. More particularly the present invention relates to a cooling device and method for cooling at least a first and a second group of electrically interconnected electrical components as well as a converter including such a cooling device.

BACKGROUND

In power transmission systems and then especially in High Voltage Direct Current (HVDC) power transmission systems, the current running through electrical components can be very high. Typical such components are current valve components like thyristors and Insulated Gate Bipolar Transistors (IGBTs). Due to these large currents, the components can generate large amounts of heat and therefore they need cooling. The way that they are cooled is therefore very important.

One cooling device in this field is described in WO 2007/149023. Here groups of electrical components to be cooled are placed in rows in a column in contact with cooling blocks. A cooling block is here provided for one or more rows including two groups of electrical components.

However, the normal way to cool components in HVDC systems is through using a cooling element or heat sink provided between the components and cooling the components in parallel using a cooling medium supplied in parallel to the cooling elements.

One problem with this approach is that a large amount of cooling medium may be used. The components may furthermore generate different amounts of heat and therefore the cooling requirements may differ.

There is therefore a need for providing a cooling which uses less cooling medium as well as considers the varying cooling requirements of the component.

SUMMARY OF THE INVENTION

One object of the present invention is to provide a cooling device for cooling at least a first and a second group of electrically interconnected electrical components, which cooling device uses limited amounts of cooling medium.

This object is according to a first aspect of the present invention obtained through a cooling device for cooling at least a first and a second group of electrically interconnected electrical components in a converter, where each group includes at least one component, where the first and second groups are placed on opposite sides of a conductor leading to a connection terminal of the converter, the device comprising:
 a first transporting arrangement arranged to transport cooling medium (M) past the first group, and
 a second transporting arrangement arranged to transport the same cooling medium past the second group,
 wherein the first transporting arrangement is placed in series with and before the second transporting arrangement for transporting cooling medium to the second transporting arrangement.

Another object of the present invention is to provide a converter, where the amount of cooling medium used is limited.

This object is according to a second aspect of the present invention obtained through a converter comprising a first group of electrically interconnected electrical components, a second group of electrically interconnected electrical components and a cooling device according to the first aspect.

Another object of the present invention is to provide a method for cooling at least a first and a second group of electrically interconnected electrical components and that uses limited amounts of cooling medium.

This object is according to a third aspect of the present invention obtained through a method for cooling at least a first and a second group of electrically interconnected electrical components in a converter and provided on opposite sides of a conductor leading to a connection terminal of the converter, where each group includes at least one component, comprising the steps of:
 transporting cooling medium past the first group, and transporting the same cooling medium past the second group after the first group has been passed The present invention has a number of advantages. Through cooling the first group before the second group using the same cooling medium less cooling medium is used compared with parallel cooling. Since the electrical components in the first group are cooled first, the cooling of these electrical components in the first group is efficient. However, also the cooling of the electrical components in the second group may be efficient enough even though they receive cooling medium that has already been used for cooling the first group. The reason for this is that the electrical components of the second group may not necessarily have the same losses as the components in the first group. This means that good cooling may be obtained despite them being provided last in the cooling chain. This has the further advantage of the cooling medium not having to be provided at the same temperature that is required for the first group. The invention therefore provides energy saving in that less cooling medium may be used in cooling and the same cooling medium can be used for cooling both groups while still obtaining sufficient cooling. Another advantage is that the number of ducts and joints are reduced.

BRIEF DESCRIPTION OF THE DRAWINGS

The present invention will in the following be described with reference being made to the accompanying drawings, where FIG. 1 schematically shows a power transmission system including converters where a cooling device of the invention is provided.

DETAILED DESCRIPTION OF THE INVENTION

A cooling device according to the invention will in the following be described in relation to power transmission systems and then more particularly in relation to a High Voltage Direct Current (HVDC) power transmission system. However, it should be realized that the invention is not limited to HVDC or even power transmission, but may be applied in any type of cooling device and then especially in any type of cooling of electrical components, through which large currents are running.

Figure 1:
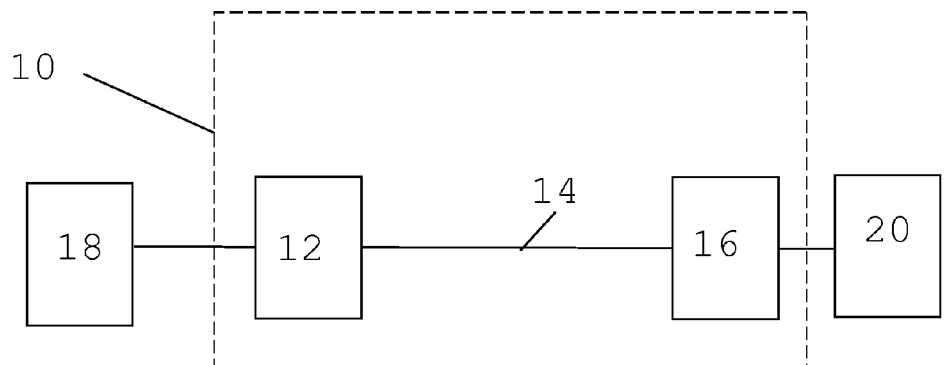

In FIG. 1 there is schematically shown a HVDC system 10 connected between a first and a second Alternating Current (AC) power transmission system 18 and 20. For this reason the HVDC system 10 includes a first converter 12 for conversion between AC and DC, which converter may be a rectifier. The first converter 12 is connected to a second converter 16 via a DC power line 14. The second converter also converts between AC and DC and connects the HVDC system 10 to the second AC power system 20. For this reason the second converter 16 may be an inverter.

Both the converters 12 and 16 may be any type of converters, such as line-commutated Current Source Converters (CSC) or forced commutated Voltage Source Converters (VSC). In the first embodiment that is being described here they are both VSCs.

Figure 2:
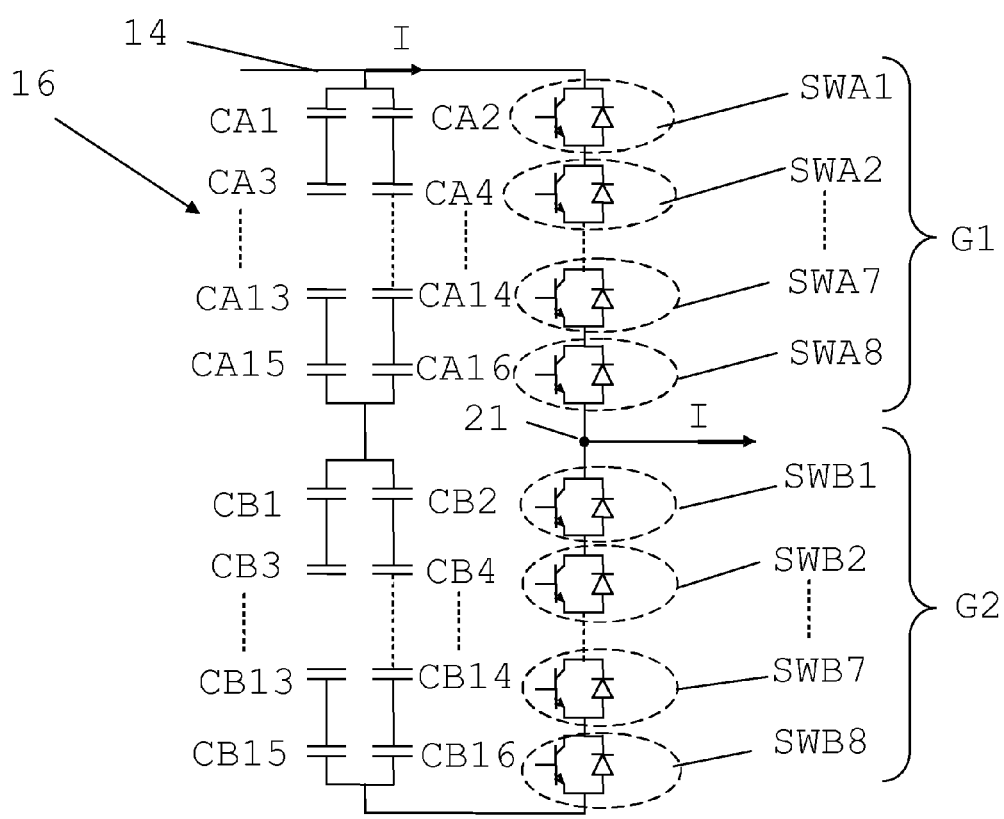
FIG. 2 shows an electric circuit diagram of a part of a converter which is to be cooled, FIG. 3 schematically shows a cross-section through the cooling device according to a first embodiment of the invention as well as through two groups of electrical components.

FIG. 2 shows an electrical circuit diagram of a part of the second converter 16. This converter is merely used to exemplify the present invention.

In FIG. 2 there is a first and a second group G1 and G2 of electrical components, in the form of switching elements. The switching elements are according to a first embodiment of the invention IGBTs, each provided as a transistor with anti-parallel diode. There are here eight components SWA1, SWA2, . . . SWA7 and SWA8 in the first group G1, where only the first two and the last two are shown, and eight components SWB1, SWB2, . . . SWB7 and SWB8 in the second group G2, where only the first two and the last two are shown. The components in the first group G1 are connected in series with each other as are the components in the second group. The two groups are furthermore electrically interconnected with each other. The first group G1 thereby forms a first string of electrical components and the second group G2 forms a second string of electrical components.

The first group G1 is at a first end, i.e. at a first end of the first string, connected to the DC line 14 and at a second end, i.e. the second opposite end of the first string, connected to a first end of the second group G2, i.e. a first end of the second string. The second end of the second group G2 may here be connected to a return DC line leading to the first converter or to ground depending on how the HVDC system is configured.

In parallel between the first and second end of the first group G1 there is provided a first capacitor bank comprising a number of parallel connected capacitors CA1, CA2, CA3, CA4, . . . CA13, CA14, CA15, CA16, CB1, CB2, CB3, CB4 . . . CB13, CB14, CB15, CB16. There are here furthermore two parallel branches provided in the first capacitor bank. There is thus a first branch of series connected capacitors CA1, CA3, . . . CA13, CA15 in parallel with a second branch of capacitors CA2, CA4, . . . CA14, CA16. In the same manner there is a second bank of capacitors provided for the second group G2. There is here a third branch of capacitors CB1, CB3, . . . CB13, CB15 in parallel with a fourth branch of capacitors CB2, CB4, . . . CB14, CB16. It should be realized that each capacitor bank could be varied in many ways. Each bank may for instance only include one capacitor. There may furthermore be more or fewer parallel capacitor branches and each branch may include at least one capacitor. There may also be fewer or more capacitors in a branch. This means that in one variation there is only one capacitor branch including several capacitors in series, while in another there are several branches in parallel, but with only one capacitor in each branch. It is possible to vary a capacitor bank according any of the above-mentioned extremes. However, there is always a capacitor bank provided for each group of switching elements. One such group thereby forms a converter cell.

In the converter of FIG. 2 there are two converter cell arms, where the first group of electrical components are provided in an upper converter cell arm and the electrical components in the second group are provided in a lower converter cell arm.

At a junction between the first and second groups G1 and G2 there is provided a first connection point 21 leading to a further group of components in a following converter cell or in the case of it being the last cell in the arm to an AC terminal for connection to the second AC system.

In FIG. 2 a major current path I is furthermore indicated. Current may enter the converter 16 at the first end of the first group G1, pass through the first group G1 and leave the converter at the first connection point 21 in order to be fed to the AC terminal leading to the second AC system. Here it should be noted that current can be reversed and instead enter the converter at the first connection point 21 and leave at the first end of the first group G1. Power can thus be delivered from the converter as well as to the converter via this connection point 21 that is connected to a first conductor 19 leading to a connection terminal, here an AC terminal, of the converter. The first and second groups G1 and G2 of electrical components are thus provided on opposite sides of this first conductor 19.

As can be seen from FIG. 2 converters typically include electrical components that are here Insulated Gate Bipolar Transistors (IGBT). In these types of systems the currents can furthermore be very high. When high currents run in such components they generate a lot of heat. They therefore have to be cooled.

Traditionally cooling has been performed through parallel cooling of components using a cooling medium like water or air, i.e. the components of both the first and the second groups are cooled in parallel.

This means on the one hand that a lot of cooling medium may be needed. However, this also means that the components are subjected to the same cooling irrespective of how much heat they generate and thus irrespective of how much cooling they actually need.

As a consequence of parallel cooling all the cooling medium that is supplied to the first and the second groups of electrical components has to be kept at a temperature that is sufficient for cooling the first group of electrical components. This thus means that cooling medium supplied to the second group is kept at this temperature even though it is not needed. This therefore also involves a waste of energy.

In a converter of the type shown in FIG. 2 the majority of the current will run through the first group of electrical components and only a lesser part through the second group. The effective current passing through the first group may here be higher than the effective current that passes through the second group. The effective current is often termed rms (root mean square) current. This means that the components in the first group are in need of more cooling than the components in the second group. The relationship may here be as high as 3:1.

The present invention is directed towards improving cooling in situations as the ones described above.

Figure 3:
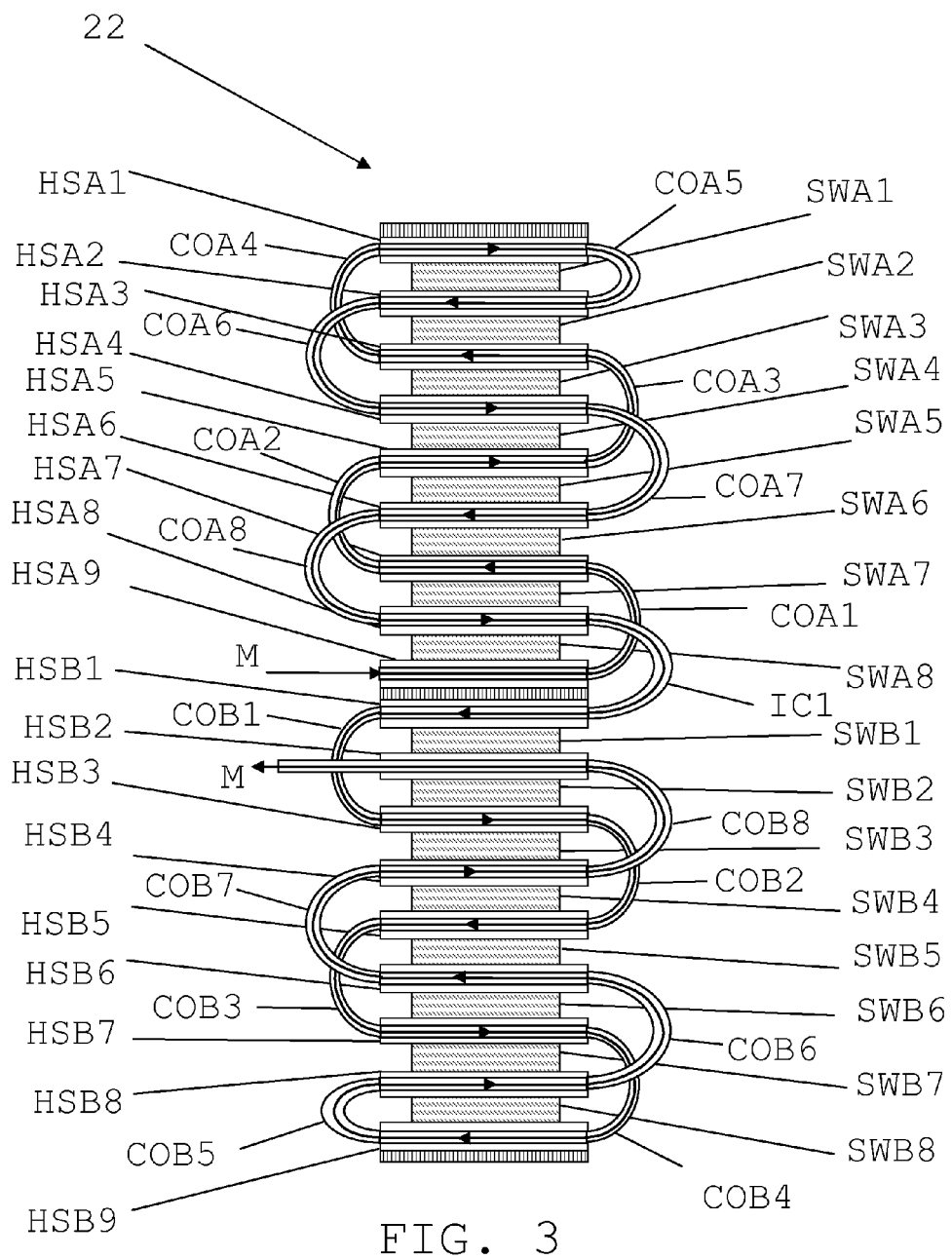

A cross-sectional view of a cooling device 22 according to a first embodiment of the invention combined with a first and a second group of electrical components is schematically shown in FIG. 3.

Here the electrical components of both the first and the second group are stacked onto each other with the first group in the top and the second group in the bottom. It should here be realized that the second group may be provided on top and the first group in the bottom. The stack is here furthermore vertical. Actually the orientation of the stack is immaterial for the cooling according to the invention. The stack may furthermore be separated into two stacks, one for each group of electrical components. However, the provision of one stack is an efficient and compact structure, especially since the components in both groups are provided close to each other.

In FIG. 3 the electrical components are placed in relation to each other, and here stacked, in a component placing order. In this example the components in the first group are provided in an upper part of the stack. More particularly a first component SWA1 is placed close to the top of the stack, below this there is a second component SWA2, which is followed by a third component SWA3. Thereafter follows a fourth component SWA4, a fifth component SWA5, a sixth component SWA6, a seventh component SWA7 and finally an eighth component SWA8. These may here be provided in the same order that they are connected electrically between the DC power line and the second group. However, this is not necessary.

In the same manner the electrical components in the second group then follow in a lower part of the stack. There is thus here a first component SWB1 placed beneath the eighth component SWA8 of the first group, below this there is a second component SWB2, which is followed by a third component SWB3. Thereafter follows a fourth component SWB4, a fifth component SWB5, a sixth component SWB6, a seventh component SWB7 and finally an eighth component SWB8 close to the bottom of the stack. These may here be provided in the same order that they are connected to the second connection point. However, this is also here not necessary.

In order to cool these components the cooling device includes two transporting arrangements, where a first transporting arrangement is arranged to transport cooling medium past the first group of electrical components and the second transporting arrangement is arranged to transport cooling medium past the second group of electrical components.

Both these transporting arrangements include a set of cooling elements in the form of heat sinks, for instance of aluminum. These cooling elements are furthermore provided with a cooling medium channel in their interior and the cooling medium channels of these cooling elements are joined together through connecting ducts. Each cooling element furthermore includes at least one cooling surface adapted to be placed in direct contact with one electrical component that is to be cooled, i.e. this surface is adapted to be placed in contact with a single electrical component. Some of these cooling elements may have two such cooling surfaces opposite of each other on opposite sides of the cooling medium channel in order to cool two electrical components. However one cooling surface only cools a single electrical component. Each cooling element is here also provided with a first end and a second opposite end, where the medium cooling channel stretches straight between the first and second ends in parallel with the cooling surfaces. For this reason also the first and second ends have openings to which the interconnecting ducts are to be connected for forming a transporting arrangement. Since the cooling elements are provided with cooling medium channels and joined together with connecting ducts the cooling elements form cooling sections of the corresponding transporting arrangement that transports cooling medium to electrical components. For this reason the cooling elements will in the following be termed cooling sections.

There is here one interconnecting duct for connecting the two transporting arrangements to each other. According to the invention the first transporting arrangement is furthermore placed before the second transporting arrangement, which means that it will receive cooling medium before the second transporting arrangement.

As was mentioned earlier, the cooling sections are here each cooling at least one electrical component and several are also cooling two through being placed between two electrical components.

The cooling sections are furthermore placed in relation to the components in a cooling section placing order that is aligned with the component placing order.

In the first embodiment this means that at the top of the stack, above the first electrical component SWA1 in the first group, a first cooling section HSA1 in a first set that is associated with this first group G1 is placed, then a second cooling section HSA2 is placed between the first and the second electrical components SWA1 and SWA2. This is followed by a third cooling section HSA3 between the second and third electrical components SWA2 and SWA3. Thereafter follows a fourth cooling section HSA4 between the third and the fourth electrical components SWA3 and SWA4. This is followed by a fifth cooling section HSA5 between the fourth and fifth electrical components SWA4 and SWA5. Next follows a sixth cooling section HSA6 between the fifth and the sixth electrical components SWA5 and SWA6. Thereafter there is a seventh cooling section HSA7 between the sixth and the seventh electrical components SWA6 and SWA7, which in turn is followed by an eighth cooling section HSA8 between the seventh and the eighth electrical components SWA7 and SWA8. The first set is then completed by a ninth cooling section HSA9 provided beneath the eighth electrical component SWA8.

In the same manner the second transporting arrangement includes a number of cooling sections in the second set placed in relation to the second group of components. There is thus here a first cooling section HSB1 above the first electrical component SWB1 in the second group. Then a second cooling section HSB2 is placed between the first and the second electrical components SWB1 and SWB2. This is followed by a third cooling section HSB3 between the second and third electrical components SWB2 and SWB3. Thereafter follows a fourth cooling section HSB4 between the third and the fourth electrical components SWB3 and SWB4. This is followed by a fifth cooling section HSB5 between the fourth and fifth electrical components SWB4 and SWB5. Next follows a sixth cooling section HSB6 between the fifth and the sixth electrical components SWB5 and SWB6. Thereafter there is a seventh cooling section HSB7 between the sixth and the seventh electrical components SWB6 and SWB7, which in turn is followed by an eighth cooling section HSB8 between the seventh and the eighth electrical components SWB7 and SWB8. The second set is then completed by a ninth cooling section HSB9 provided beneath the eighth electrical component SWB8.

An electrically insulating spacing element may here be provided between the two transporting arrangements, i.e. between the ninth cooling section HSA9 of the first set and the first cooling section HSB1 of the second set. Insulating elements may also be placed above and below the structure, i.e. above the first cooling section HSA1 of the first set and below the ninth cooling section HSB9 of the second set.

The cooling sections are thus placed in a cooling section placing order that is aligned with the electrical component placing order. This means that here the cooling sections are placed in the cooling section placing order and in-between the cooling sections the electrical components are placed according to their electrical component placing order, which is here the order in which they are connected in series with each other in the respective groups.

However, in order to provide the desired cooling the cooling sections are according to this first embodiment not connected to each other according to the cooling section placing order, rather they follow sequentially after each other according to another order, here a cooling section passing order, which is the order in which a cooling medium is to pass the cooling sections in order to provide sequential cooling of the electrical components of the two groups according to the cooling section passing order.

This means that in the first transporting arrangement, i.e. in the first set of cooling sections, the first end of the ninth cooling section HSA9 is open in order to form an inlet for the cooling medium M. The second opposite end of the ninth cooling section HSA9 is joined via a first connecting duct COA1 to the second end of the seventh cooling section HSA7. The first end of the seventh cooling section HSA7 is then joined to the first end of the fifth cooling section HSA5 via a second connecting duct COA2. The second end of the fifth cooling section HSA5 is joined to the second end of the third cooling section HSA3 via a third connecting duct COA3. The first end of the third cooling section HSA3 is then joined to the first end of the first cooling section HSA1 via a fourth connecting duct COA4. The second end of the first cooling section HSA1 is joined to the second end of the second cooling section HSA2 via a fifth connecting duct COA5, i.e. the first odd cooling section is joined to the first even section of the cooling section placing order. The first end of the second cooling section HSA2 is joined to the first end of the fourth cooling section HSA4 via a sixth connecting duct CO6. The second end of the fourth cooling section HSA4 is connected to the second end of the sixth cooling section HSA6 via a seventh connecting duct CO7. The first end of the sixth cooling section HSA6 is finally connected to the first end of the eighth cooling section HSA8 via an eighth connecting duct CO8. The second end of the eighth cooling section HSA8 is here the point where the cooling medium leaves the first transporting arrangement. In order to be connected to the second transporting arrangement, the second end of the eighth cooling section HSA8 is here connected to the cooling sections of the second set using a first interconnecting duct IC1, i.e. to the cooling sections that are a part of the second transporting arrangement associated with the second group of electrical components.

The above described cooling sections and connecting ducts thus make up the first transporting arrangement.

The first interconnecting duct IC1 therefore leads to the second end of the first cooling section HSB1 of the second set. The first end of the first cooling section HSB1 is then joined to the first end of the third cooling section HSB3 via a first connecting duct COB1. The second end of the third cooling section HSB3 is joined to the second end of the fifth cooling section HSB5 via a second connecting duct COB2. The first end of the fifth cooling section HSB5 is joined to the first end of the seventh cooling section HSB7 via a third connecting duct COB3. The second end of the seventh cooling section HSB7 is joined to the second end of the ninth cooling section HSB9 via a fourth connecting duct COB4. The first end of the ninth cooling section HSB9 is joined to the first end of the eighth cooling section HSB8 via a fifth connecting duct COB5. The second end of the eighth cooling section HSB8 is joined to the second end of the sixth cooling section HSB6 via a sixth connecting duct COB6. The first end of the sixth cooling section HSB6 is connected to the first end of the fourth cooling section HSB4 via a seventh connecting duct COB7. The second end of the fourth cooling section HSB4 is finally connected to the second end of the second cooling section HSB2 via an eighth connecting duct COB8. The first end of the second cooling section HSB2 thereafter forms the outlet for the cooling medium M, i.e. the point where it leaves the second transporting arrangement and in this first embodiment also where it leaves the whole cooling device.

The above described cooling sections and connecting ducts make up the second transporting arrangement.

In summary, in the first cooling section placing order, the odd cooling sections of a set are interconnected with odd cooling sections of the set and even cooling sections of the set are interconnected with even cooling sections of the set.

Cooling medium that can be used is here with advantage de-ionized water, perhaps combined with glycol.

It should here be realized that the cooling device may be connected to a cooling medium propulsion unit, like a pump or a fan, and if cooling medium is provided in a closed loop there may be a cooling medium collection mechanism and a cooling medium temperature regulating mechanism for lowering the temperature of cooling medium that has been used for cooling electrical components.

Figure 4:
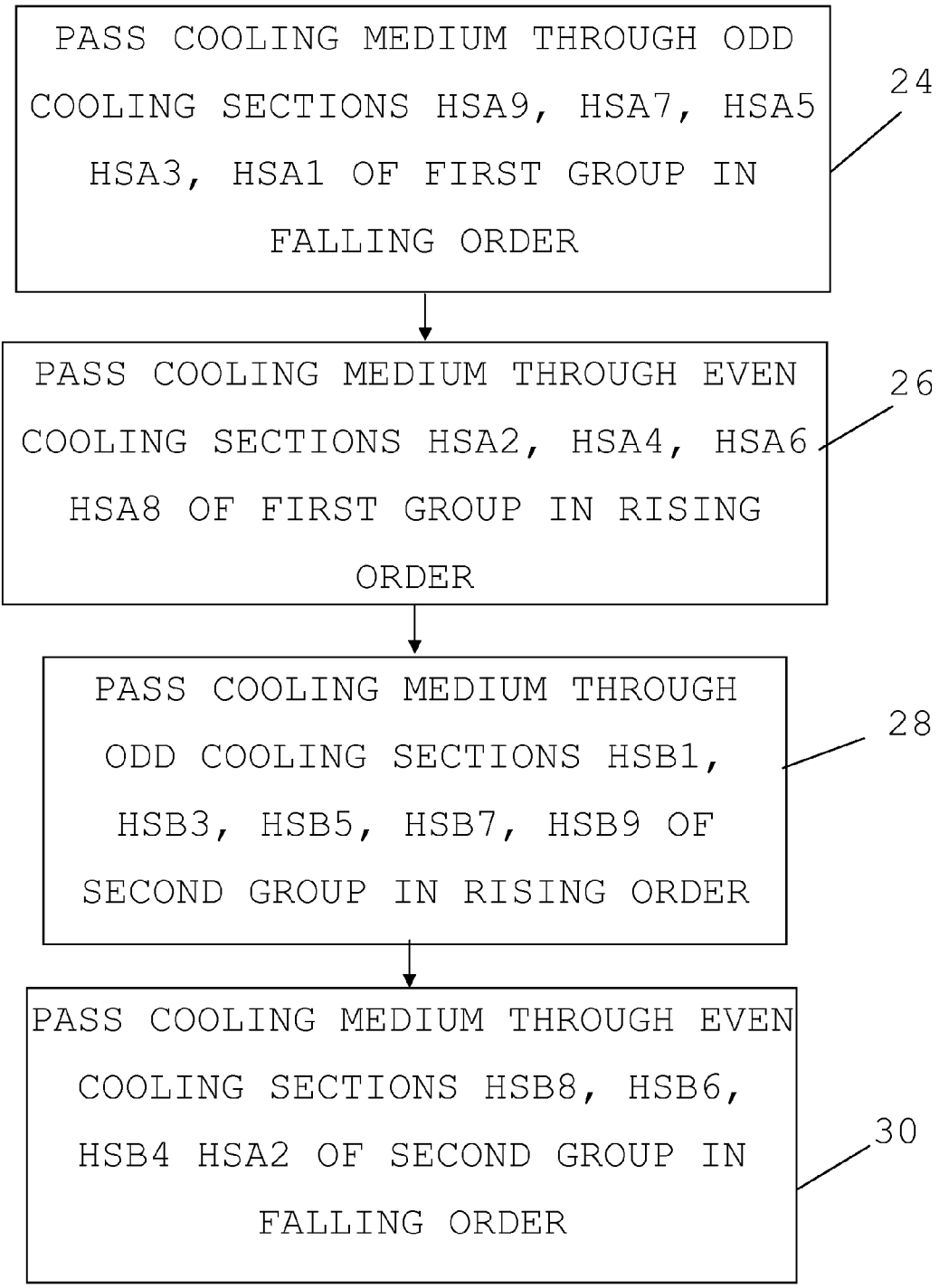
FIG. 4 shows a flow chart of a number of method steps in a method for cooling two groups of electrically connected electrical components according to the first embodiment of the invention.

The cooling operation will now be described with reference being made to FIG. 4, which shows a flow chart of a number of method steps being performed in a method for cooling groups of electrical components according to the first embodiment of the invention.

Cooling medium M first of all passes the first set of cooling sections before it passes the second set of cooling sections. Cooling medium M is thus according to the invention first transported past the first group of electrical components and the transported past the second group of electrical components after the first group of electrical components has been passed.

In somewhat more detail, cooling medium M is pumped into the inlet of the cooling device, which inlet is thus provided at the first end of the ninth cooling section HSA9 of the first transporting arrangement, i.e. at the middle of the stack. The cooling medium is then first passed sequentially from odd cooling section to odd cooling section of the cooling section placing order, i.e. through the first, third, fifth, seventh and ninth cooling sections HSA1, HSA3, HSA5 and HSA7. Here it is furthermore passed in a falling order, step 24. This means that the cooling medium goes first into the ninth cooling section HSA9, then into the seventh cooling section HSA7. From there it is forwarded to the fifth cooling section HSA5 and then onwards to the third cooling section HSA3 and finally into the first cooling section HSA1.

As the cooling medium has successfully passed the odd cooling sections of the cooling section placing order, it is then passed through the even cooling sections HSA2, HSA4, HSA6 and HSA8 of the cooling section placing order, i.e. it is passed sequentially from even cooling section to even cooling section in the cooling section placing order. Here the cooling medium M passes the evenly numbered cooling sections in rising order, step 26. This means that the cooling medium goes first into the second cooling section HSA2, then into the fourth cooling section HSA4. From there it is forwarded to the sixth cooling section HSA6 and finally into the eighth cooling section HSA8.

After having passed all the cooling sections of the first set in the first transporting arrangement, the cooling medium M is then forwarded to the second set of cooling sections in the second transporting arrangement.

Cooling medium thus first enters the second end of the first cooling section HSB1. The cooling medium is then passed through the odd cooling sections of the cooling section placing order, i.e. through the first, third, fifth, seventh and ninth cooling sections HSB1, HSB3, HSB5, HSB7 and HSB9. Here it is furthermore passed in a rising order, step 28. This means that the cooling medium goes first into the first cooling section HSB1, then into the third cooling section HSB3. From there it is forwarded to the fifth cooling section HSB5, then onwards to the seventh cooling section HSB7 and finally into the ninth cooling section HSB9.

As the cooling medium has successfully passed the odd cooling sections of the cooling section placing order, it is then passed through the even cooling sections HSB2, HSB4, HSB6 and HSB8 of the cooling section placing order. Here the cooling medium M passes the even cooling sections in falling order, step 30. This means that the cooling medium M first enters the eighth cooling section HSB8 and then goes into the sixth cooling section HSB6. From there it is forwarded to the fourth cooling section HSB4 and finally into the second cooling section HSB2, the first end of which provides the outlet for the cooling medium M.

The invention according to this first embodiment has several advantages. Through passing the cooling medium through the cooling sections of the first set before the cooling sections of the second set there is an advantage in that less cooling medium is required than when providing parallel cooling. Since the cooling sections in the first set, which cool the electrical components in the first group, are provided with cooling medium first, the cooling of these electrical components in the first group is efficient. However, also the cooling of the electrical components in the second group is efficient enough even though they receive cooling medium that has already passed the first set of cooling sections. The amount of water used may thus be optimized. The reason for this is that the electrical components of the second group do not have the same losses as the components in the first group. This means that good cooling is obtained despite them being provided last in the cooling chain. This has the further advantage of the cooling medium not having to be provided at the same temperature that is required for the first group. The invention therefore provides energy saving in that less cooling medium may be used in cooling and the same cooling medium can be used for cooling both groups while still obtaining sufficient cooling.

Through combining passing cooling medium via the oddly numbered cooling sections in one direction and via the evenly numbered cooling sections in the opposite direction, i.e. according to rising or falling cooling section placing orders, a further advantage is obtained. The advantage is that the average water temperature for each electrical component is lowered as compared with parallel cooling and therefore a more efficient cooling is obtained.

Yet another advantage is that the number of ducts and joints are reduced. This reduces the risk of leakage. If courser ducts and cooling medium channels are used, then the risk for congestion and disturbances in the cooling system is reduced.

There are several variations that may be made of the present invention.

In relation to the transporting arrangements there are many possible different configurations. The inlet may for instance be provided at the top of a set of cooling sections. It may thus be placed at any end of the cooling section placing order. In the same way the outlet may be provided at any end of a transporting arrangement. In the first embodiment cooling medium entered and left the first transporting arrangement at high number of the cooling placing order, i.e. at the bottom of the first transporting arrangement. They could as an alternative be placed at a low number of the cooling placing order, i.e. at the top of the first transporting arrangement. In the first embodiment cooling medium furthermore passed the odd cooling sections of the cooling section placing order before passing even cooling sections of the cooling section placing order. It should be realized that the opposite can also be done, i.e. that cooling medium enters a transporting arrangement at the first or last even cooling section of the cooling section placing order, then passes the even cooling sections sequentially, whereupon the odd cooling sections are passed in the opposite sequence and then the cooling medium leaves the transporting arrangement from the last or the first odd cooling section. This means that cooling medium will enter at one end of a number of stacked cooling sections and pass through every other cooling section towards the opposite end of the stack and then return via the remaining cooling sections towards the first end where it leaves the stack.

In another variation it is possible that cooling medium will first pass sequentially through odd or even cooling sections of the cooling section placing order in one direction, i.e. in a falling or rising order and then proceed with sequential passing of the remaining cooling sections in the same direction, i.e. in the same order.

It is furthermore possible that cooling medium is provided sequentially according to the cooling section placing order. This may in relation to the example of FIG. 3 mean that for instance in the first set cooling medium may be supplied sequentially from the first to the ninth cooling sections or vice versa and then the second set is provided with the same cooling medium in the same or the opposite order. The cooling sections may therefore be connected to each other sequentially in the cooling section placing order. In this cased the cooling section placing order and the cooling section passing order are the same This will not provide the same even temperature as in the first embodiment. However, the first group of electrical components is still cooled more than the second group and the number of connections as well as the limitation of the amount of cooling medium used is still obtained through this type of serial cooling.

It is furthermore possible with parallel cooling within a group of electrical components. This may be done in a variation of the device shown in FIG. 3 through using a first inlet manifold connecting the inlet with the first end of all cooling sections in the first set in parallel. Here the second ends of the cooling sections in the first set may be connected to an outlet manifold, that would in turn be connected to an inlet manifold connected to the first ends of the second set of cooling sections, where the second ends of the second sections would then be connected to an outlet manifold leading to the medium outlet. Of course the manifolds could here be connected to any ends of the cooling sections. In operation the cooling medium would then first be transported in parallel past the first group of electrical components and thereafter the cooling medium would be transported in parallel past the second group of electrical components.

In the example above the cooling medium was a fluid and more particularly a liquid. However it is also possible that the fluid is a gas, such as air. The last described variation of the invention is particularly well suited for being used when the cooling medium is a gas, like air.

It is furthermore possible that the electrical components when being provided as current valve elements, such as power transistors, like IGBTs, can be provided in the form of converter cells without internal electrical series connection. Here each cell is made up of two components together with a capacitor bank.

Figure 5:
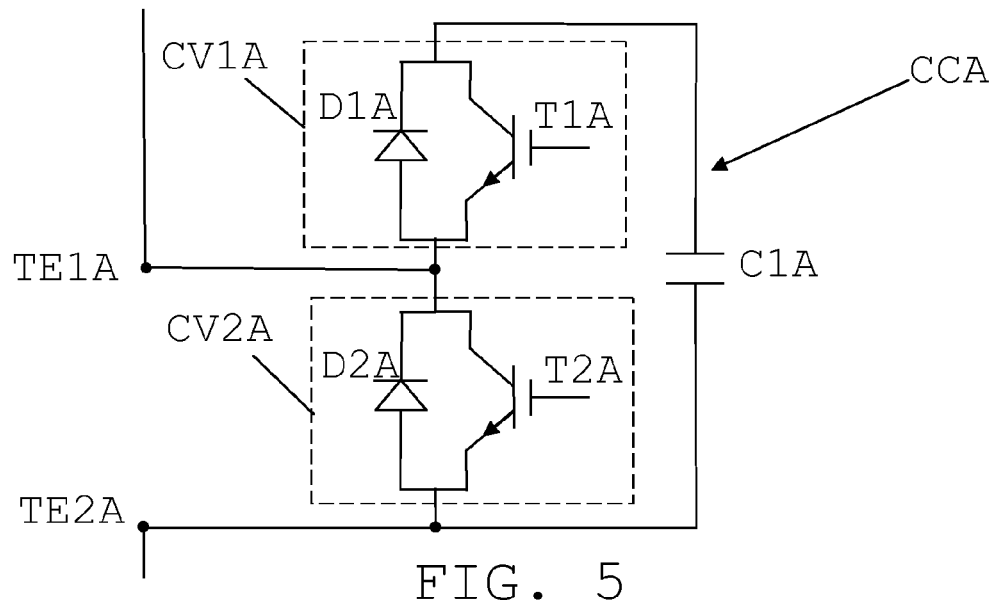
FIG. 5 shows the structure of a first type of voltage source converter cell that may be cooled by a cooling device according to the invention.

One first type of such a cell structure CCA is schematically shown in FIG. 5. The cell CCA is a half-bridge converter cell and includes an energy storage element, here in the form of a capacitor C1A, which is connected in parallel with a first group of current valve elements. The current valve elements in the first group are connected in series with each other. The first group here includes two current valve elements CV1A and CV2A (shown as dashed boxes), where each current valve element CV1A, CV2A is realized in the form of a switch that may be an IGBT (Insulated Gate Bipolar Transistor) transistor together with an anti-parallel diode. In FIG. 5 there is therefore a first current valve element CV1A having a first transistor T1A with a first diode D1A oriented upwards in the figure, which is towards the capacitor C1A, and connected in parallel between emitter and collector of the transistor T1A. There is also a second current valve element CV2A connected in series with the first current valve element CV1A and having a second diode D2A with the same orientation as the first diode D1A and connected in parallel between emitter and collector of a second transistor T2A.

The cell has a first connection terminal TE1A and a second connection terminal TE2A, each providing a connection for the cell in a voltage source converter. In this first type of cell the first connection terminal TE1A more particularly provides a connection to the junction between the first and the second current valve element CV1A and CV2A, while the second connection terminal TE2A provides a connection to the junction between the second current valve element CV2A and the capacitor C1A. These connection terminals TE1A and TE1B thus provide points for connection of the cell in a converter.

This type of cell would typically replace two electrical components of a group. A group of electrical components in a converter can then be provided through connecting several such cells in series with each other with the first terminal of a cell connected to the second terminal of following cell in the group or string of cells.

Figure 6:
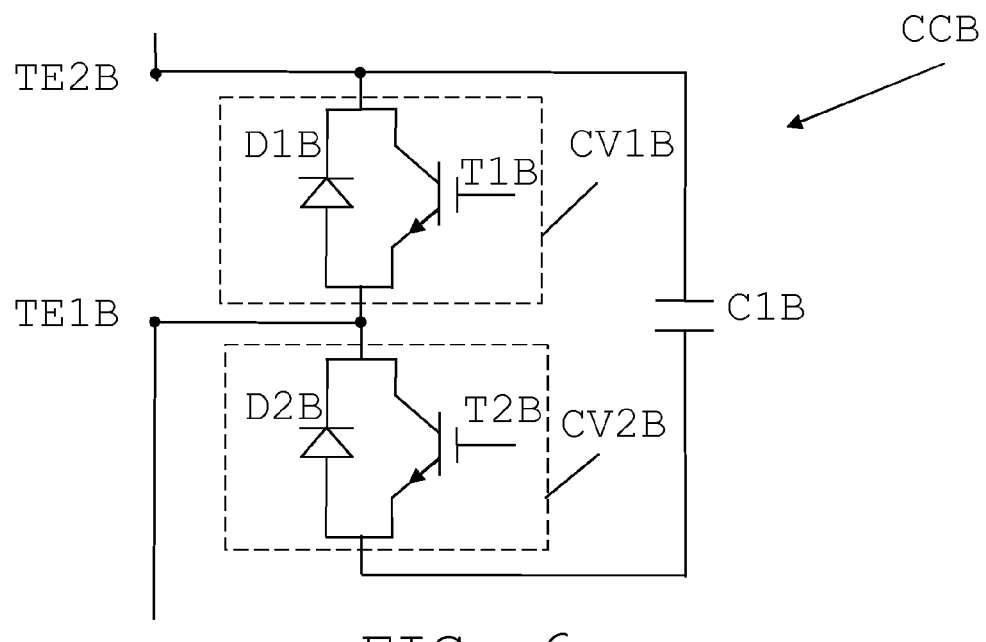
FIG. 6 shows the structure of a second type of voltage source converter cell that may be cooled by a cooling device according to the invention, FIG. 7 schematically shows a variation of the converter in FIG. 2, which converter is cooled by a cooling device according to a second embodiment of the present invention, and FIG. 8 schematically shows a variation of a converter having converter cells according to FIG. 5, which converter is cooled by a cooling device according to a third embodiment of the present invention.

A second type of cell that can be connected in a converter is shown in FIG. 6. Also this cell is a half-bridge converter cell CCB having the same type of components as the first exemplifying cell and being interconnected in the same way. There is thus here a first group of current valve elements including first current valve element CV1B (shown as a dashed box) having a first transistor T1B and a first anti-parallel diode D1B in series with a second current valve element CV2B (also shown as a dashed box) having a second transistor T2B with a second anti-parallel diode D2B. In parallel with this first group of current valve elements there is a first energy storage element, also here in the form of a capacitor C1B, where the first current valve element CV1B of this cell CCB according to this second type has the same position and orientation as the first current valve element of the first type and the second current valve element CV2B of this second type has the same position and orientation as the second current valve element of the first type. There is also here a first connection terminal TE1B providing a connection to the connection point between the first and the second current valve elements CV1B and CV2B. However as opposed to the cell of the first type the second connection terminal TE2B of this second type provides a connection to the junction between the first current valve element CV1B and the capacitor C1B. A string of such cells of the second type can in the same way as the cells of the first type replace the electrical components of a group as shown in FIG. 2.

Figure 7:
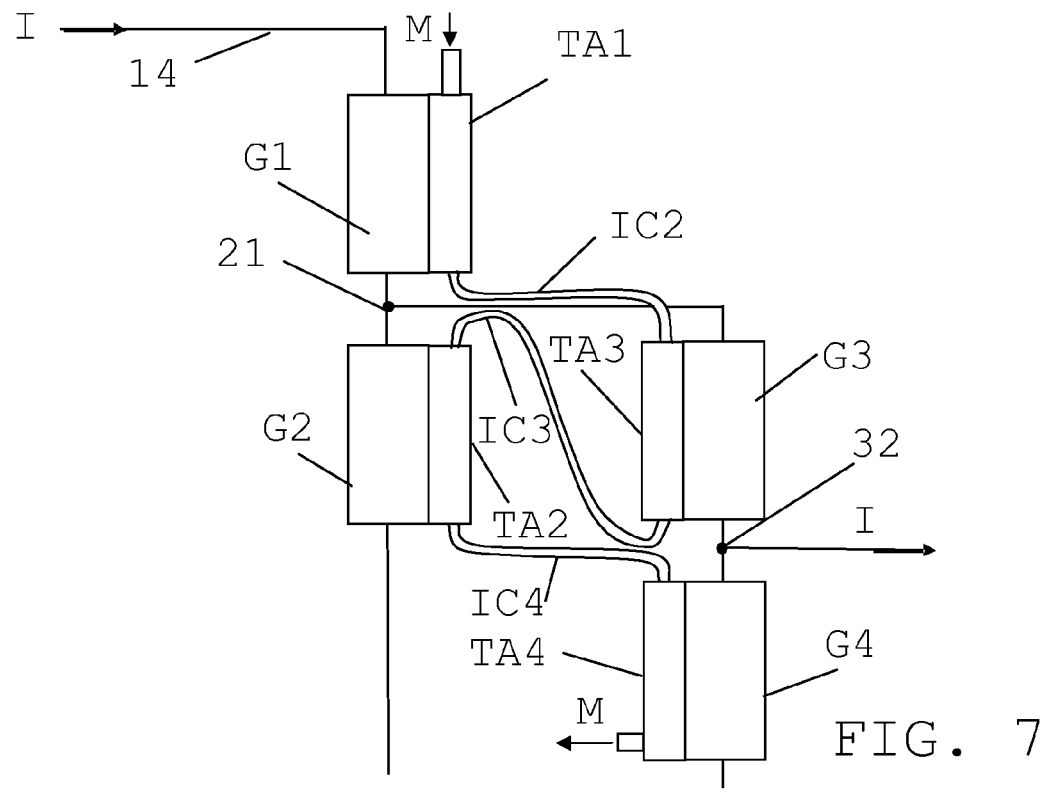

In the first embodiment there were only a first and a second group of components. In a converter it is possible with further groups. A second embodiment of the invention that exemplifies this will now be described with reference being made to FIG. 7, which schematically shows a part of a converter according to this second embodiment of the invention.

Here there is a first and a second group G1 and G2 of electrical components interconnect with each other in the same way as in the first embodiment. The groups are here only shown as boxes. It should be realized that they include series-connected electrical components in the same way as has been described earlier. In this second embodiment the first connection point 21 between the first and the second group G1 and G2 does not directly lead to an AC terminal for connection to the second AC system. This first connection point 21 leads to a third and a fourth group G3 and G4 of electrical components (indicated as boxes). More particularly this first connection point 21 is joined to a conductor leading to the first end of the third group G3. The second end of the third group G3 is connected to a first end of the fourth group G4. However, in relation to the first and second groups the first connection point 21 is still connected to a first conductor 19 leading to the converter connection terminal, although via at least the third group. There is here a second connection point 32, where the third group G3 is connected to the fourth group G4. This second connection point 32 is this connected to a second conductor 34 that leads to a connection terminal, also here an AC terminal, of the converter for connection to the second AC system. The third and fourth groups G3 and G4 are provided on opposite sides of this second conductor 34.

In this configuration a major current path is provided between the DC power line 14 and the second connection point 32. Generally a major part of the current may enter the converter at the first end of the first group G1, pass through the first group G1 then branch off at the first connection point 21, enter the third group G3, pass through the third group G3 and then leave the converter via the second connection point 32. This means that a lot of current will pass the first and the third groups G1 and G3 and not as much through the second and the fourth groups G2 and G4.

Therefore a cooling device including four transporting arrangements TA1, TA2, TA3, TA4 are shown (also indicated as boxes), where the first transporting arrangement TA1 may be configured as in the first embodiment, the third transporting arrangement TA3 be configured as the second transporting arrangement in the first embodiment, the second transporting arrangement TA2 be configured as the first transporting arrangement in the first embodiment and the fourth transporting arrangement TA4 be configured as the second transporting arrangement of the first embodiment. However, they may each be provided in the form of any of the previously described variations.

Here the inlet is provided at the first arrangement TA1, which is connected to the third transporting arrangement TA3 via a second interconnecting duct IC2. The third transporting arrangement TA3 is in turn connected to the second transporting arrangement TA2 via a third interconnecting duct IC3 and the second transporting arrangement TA2 is connected to the fourth transporting arrangement TA4 via a fourth interconnection duct IC4. The outlet is then provided from the fourth transporting arrangement TA4.

This type of device guarantees that the first and third groups G1 and G3 are cooled before the second and fourth groups G2 and G4.

It should here be realized that the second embodiment may be varied in that it is possible to add more groups in a similar manner, which groups are provided with transporting arrangements for cooling in the same way.

Figure 8:
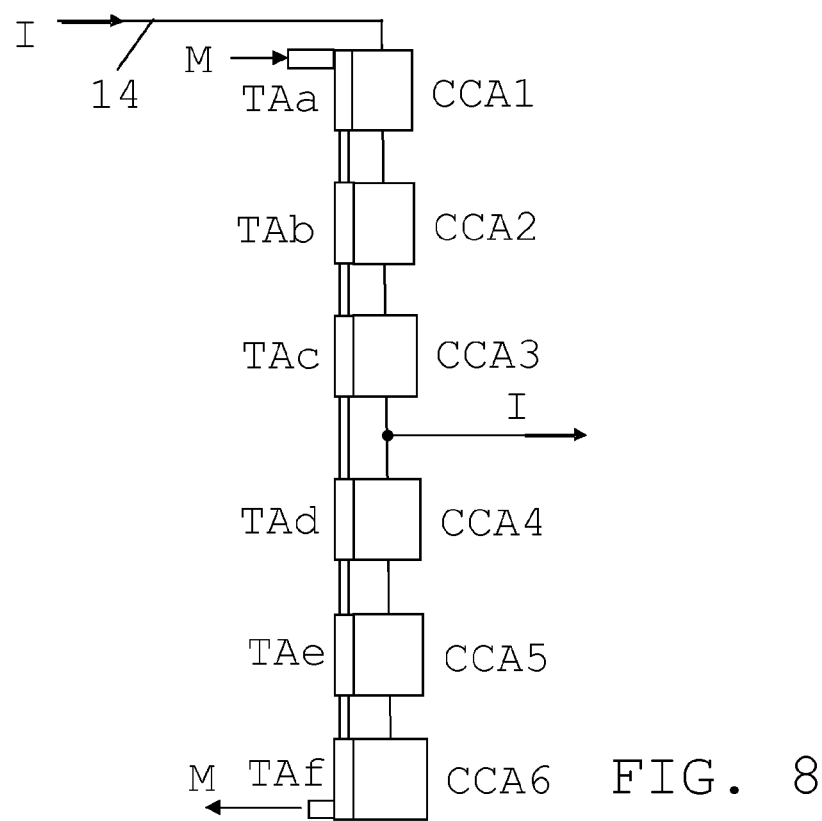

FIG. 8 shows a cooling arrangement according to a third embodiment for cells CCA1, CCA2, CCA3, CCA4, CCA5 and CCA6 of the type described in relation to FIG. 5 being connected in cascade. There are here three cells CCA1, CCA2 and CCA3 in an upper converter arm and three cells CCA4, CCA5 and CCA6 in a lower converter arm. Each of these cells is provided with a corresponding transporting arrangement TAa, TAb, TAc, Tad, TAe and TAf, connected such that the cells in the upper arm are cooled before the cells in the lower arm.

The current valve elements used in the cells have been described as employing IGBTs. It should be realized that other types of current valve elements may be used, such as elements based on thyristors, MOSFET transistors, GTOs (Gate Turn-Off Thyristor), IGCTs (Integrated Gate Commuted Thyristor) and mercury arc valves.

From the foregoing discussion it is evident that the present invention can be varied in a multitude of ways. The number of electrical components in a group can for instance be varied, where the above described eight were only an example. The numbers in two related groups are however with advantage the same. It shall consequently be realized that the present invention is only to be limited by the following claims.

The invention claimed is:

1. A cooling device for a converter, the converter comprising at least a first and a second group of electrically interconnected electrical components stacked onto each other in at least one stack in the converter, where each group includes more than one electrical component that are electrically connected in series with each other and the first and second groups are placed on opposite sides of a connection point connected to a conductor leading to a connection terminal of the converter and the first group of electrical components include components through which a higher effective current runs than the second group, the cooling device being operable for cooling at least said first and second group of electrically interconnected electrical components of the converter and comprising:
a first transporting arrangement arranged to transport cooling medium past the first group; and
a second transporting arrangement arranged to transport the same cooling medium past the second group,
wherein the first transporting arrangement is placed in series with and before the second transporting arrangement for transporting cooling medium to the second transporting arrangement,
each transporting arrangement further comprising a set of cooling sections and each cooling section includes at least one cooling surface adapted to be placed in contact with a single electrical component, where several cooling sections have two cooling surfaces opposite of each other and are adapted to be placed between two electrical components of a stack,
wherein each electrical component comprises a transistor with anti-parallel diode.

2. The cooling device according to claim 1, wherein the cooling sections of a set are placed sequentially after each other in a stack according to a cooling section placing order, where each cooling section within a set is placed for cooling at least one corresponding component in the group and the cooling sections of the set are connected in series for sequential cooling of the components in the group.

3. The cooling device according to claim 2, wherein the cooling sections are interconnected in the cooling section placing order, where odd cooling sections of the cooling section placing order are interconnected with odd cooling sections and even cooling sections of the cooling section placing order are interconnected with even cooling sections.

4. The cooling device according to claim 3, wherein the odd cooling sections of the cooling section placing order are placed so that the medium is passed through them before it passes through the even cooling sections of the cooling section placing order.

5. The cooling device according to claim 3, wherein the odd cooling sections of the cooling section placing order are placed for receiving cooling medium in a rising order and the even cooling sections of the cooling section placing order are placed for receiving cooling medium in a falling order.

6. The cooling device according to claim 4, wherein the odd cooling sections of the cooling section placing order are placed for receiving cooling medium in a rising order and the even cooling sections of the cooling section placing order are placed for receiving cooling medium in a falling order.

7. A converter comprising:
a first group of electrically interconnected electrical components;
a second group of electrically interconnected electrical components and stacked onto each other in at least one stack, where each electrical component comprises a transistor with anti-parallel diode and each group includes more than one electrical component that are electrically connected in series with each other, the first and second groups are placed on opposite sides of a connection point connected to a conductor leading to a connection terminal of the converter, the first group of electrical components includes components through which a higher effective current runs than the second group; and
the cooling device according to claim 1.

8. The converter according to claim 7, wherein the electrical components include current valve elements.

9. The converter according to claim 8, wherein the electrical components include converter cells, where each cell comprises current valve elements connected in pairs together with a corresponding energy source for forming converter cells that together form a group.

10. The converter according to claim 8, wherein the first and second groups are connected in series with each other and further comprising a third and a fourth group connected in series with each other, where the third group is electrically connected to a connection point between the first and second groups and the cooling device includes a third and a fourth cooling medium transporting arrangement, where the third and fourth transporting arrangements are placed in series with the first and second transporting arrangements and the third transporting arrangement is placed after the first transporting arrangement for receiving cooling medium before the second and fourth transporting arrangements.

11. The converter according to claim 7, wherein the first and second groups are connected in series with each other and further comprising a third and a fourth group connected in series with each other, where the third group is electrically connected to a connection point between the first and second groups and the cooling device includes a third and a fourth cooling medium transporting arrangement, where the third and fourth transporting arrangements are placed in series with the first and second transporting arrangements and the third transporting arrangement is placed after the first transporting arrangement for receiving cooling medium before the second and fourth transporting arrangements.

12. A method for cooling at least a first and a second group of electrically interconnected electrical components, each comprising a transistor with anti-parallel diode and stacked onto each other in at least one stack in a converter and provided on opposite sides of a connection point connected to a conductor leading to a connection terminal of the converter, where each group includes more than one electrical component that are electrically connected in series with each other and the first group of electrical components include components through which a higher effective current runs than the second group, where there is a set of cooling sections for each group, where each cooling section includes at least one cooling surface placed in contact with a single electrical component, and several cooling sections in a set have two cooling surfaces opposite of each other and are placed between two electrical components of a stack, the method comprising the steps of:

transporting cooling medium past the first group; and
transporting the same cooling medium past the second group after the first group has been passed.

13. The method according to claim 12, where the cooling sections of each set are placed sequentially after each other in a stack and in contact with components of a corresponding group according to a cooling section placing order, where each cooling section within a set is to cool at least one component in the corresponding group and the steps of transporting cooling medium past the first and the second groups comprises transporting cooling medium sequentially through the cooling sections.

14. The method according to claim 13, wherein the steps of transporting cooling medium past the first and the second groups comprises passing medium sequentially in a set from odd cooling section to odd cooling section of the cooling section placing order as well as sequentially in the set from even cooling section to even cooling section of the cooling section placing order.

15. The method according to claim 14, wherein the medium is passed through the odd cooling sections of the cooling section placing order of a set before the even cooling sections of the cooling section placing order.

16. The method according to claim 15, wherein the steps of passing cooling medium past the odd cooling sections of the cooling section placing order and past the even cooling sections of the cooling section placing order comprises passing the cooling medium through the odd cooling sections in a rising order and passing the cooling medium through the even cooling sections of the cooling section in a falling order.

17. A converter comprising:
a first group of electrically interconnected electrical components;
a second group of electrically interconnected electrical components and stacked onto each other in at least one stack, where each electrical component comprises a transistor with anti-parallel diode and each group includes more than one electrical component that are electrically connected in series with each other, the first and second groups are placed on opposite sides of a connection point connected to a conductor leading to a connection terminal of the converter, the first group of electrical components includes components through which a higher effective current runs than the second group; and
the cooling device according to claim 2.

18. A converter comprising:
a first group of electrically interconnected electrical components;
a second group of electrically interconnected electrical components and stacked onto each other in at least one stack, where each electrical component comprises a transistor with anti-parallel diode and each group includes more than one electrical component that are electrically connected in series with each other, the first and second groups are placed on opposite sides of a connection point connected to a conductor leading to a connection terminal of the converter, the first group of electrical components includes components through which a higher effective current runs than the second group; and
the cooling device according to claim 3.

19. A converter comprising:
a first group of electrically interconnected electrical components;
a second group of electrically interconnected electrical components and stacked onto each other in at least one stack, where each electrical component comprises a transistor with anti-parallel diode and each group includes more than one electrical component that are electrically connected in series with each other, the first and second groups are placed on opposite sides of a connection point connected to a conductor leading to a connection terminal of the converter, the first group of electrical components includes components through which a higher effective current runs than the second group; and
a cooling device according to claim 4.

20. A converter comprising:
a first group of electrically interconnected electrical components;
a second group of electrically interconnected electrical components and stacked onto each other in at least one stack, where each electrical component comprises a transistor with anti-parallel diode and each group includes more than one electrical component that are electrically connected in series with each other, the first and second groups are placed on opposite sides of a connection point connected to a conductor leading to a connection terminal of the converter, the first group of electrical components includes components through which a higher effective current runs than the second group; and
a cooling device according to claim 5.

* * * * *